(12) United States Patent
Gordon et al.

(10) Patent No.: US 11,143,717 B2
(45) Date of Patent: Oct. 12, 2021

(54) MULTI-PHASE SENSOR MODULE, SYSTEMS AND METHODS

(71) Applicant: Synaptec Limited, Strathclyde (GB)

(72) Inventors: Neil Gordon, Strathclyde (GB); Philip Orr, Strathclyde (GB); Pawel Niewczas, Strathclyde (GB)

(73) Assignee: Synaptec Limited, Strathclyde (GB)

( * ) Notice: Subject to any disclaimer, the term of this patent is extended or adjusted under 35 U.S.C. 154(b) by 49 days.

(21) Appl. No.: 16/500,368

(22) PCT Filed: Apr. 5, 2018

(86) PCT No.: PCT/GB2018/050918
§ 371 (c)(1),
(2) Date: Oct. 2, 2019

(87) PCT Pub. No.: WO2018/185490
PCT Pub. Date: Oct. 11, 2018

(65) Prior Publication Data
US 2021/0103007 A1    Apr. 8, 2021

(30) Foreign Application Priority Data

Apr. 6, 2017   (GB) .................................... 1705578

(51) Int. Cl.
*G01R 31/58*     (2020.01)
*G01R 15/18*     (2006.01)
*G01R 15/24*     (2006.01)

(52) U.S. Cl.
CPC ........... *G01R 31/58* (2020.01); *G01R 15/181* (2013.01); *G01R 15/248* (2013.01)

(58) Field of Classification Search
CPC ............ G01R 31/58–60; G01R 15/248; G01R 15/181
See application file for complete search history.

(56) References Cited

U.S. PATENT DOCUMENTS

| | | | | |
|---|---|---|---|---|
| 4,542,338 A | * | 9/1985 | Arditty | ................ G01R 15/246 |
| | | | | 324/117 R |
| 4,616,177 A | * | 10/1986 | McClain | ................ G01R 11/04 |
| | | | | 324/107 |

(Continued)

*Primary Examiner* — Patrick Assouad
*Assistant Examiner* — Demetrius R Pretlow
(74) *Attorney, Agent, or Firm* — Christopher M. Scherer; DeWitt LLP

(57) ABSTRACT

The invention enables the measurement of the voltage between phases (phase-to-phase voltages) of a multi-phase power cable, e.g. a three-phase power cable, such as may be used in subsea or subterranean environments for electrical power transfer. The invention does not require a power supply at the measurement location, and relies solely on optical fibres (typically present in such cables) to carry light to and from the sensors. Fibre Bragg grating (FBG) based sensors sample the electric field between conductors and convert to a strain on the fibre, as a result of which certain wavelengths of the reflected light are modulated by the instantaneous magnitude of the phase-to-phase voltages to be measured. A sensor module embodying the invention includes a spacer which holds the conductors in a predetermined geometry and locates the FBG sensors between pairs of conductors on which the phase-to-phase voltage measurements are to be performed. At an end of the cable, an interrogation system can extract and interpret the modulation of these wavelengths to infer the measured values of voltage. The invention may be incorporated into a repair splice for retrofitting purposes, and may also incorporate FBG-based current sensors to simultaneously measure current in the conductors.

20 Claims, 5 Drawing Sheets

(56) References Cited

U.S. PATENT DOCUMENTS

| | | | | |
|---|---|---|---|---|
| 5,406,195 A * | 4/1995 | Schweitzer, Jr. | .... | G01R 15/241 310/303 |
| 5,635,829 A * | 6/1997 | Hamada | ...... | G01R 15/247 324/96 |
| 6,140,810 A * | 10/2000 | Bohnert | ...... | G01R 15/241 324/72 |
| 6,275,021 B1 * | 8/2001 | Windsheimer | ...... | G01R 22/00 324/120 |
| 6,362,615 B1 * | 3/2002 | Davidson | ...... | G01R 1/071 324/754.27 |
| 7,394,982 B2 * | 7/2008 | Kern | ...... | G01R 15/248 398/108 |
| 10,627,454 B2 * | 4/2020 | Ni | ...... | H02H 5/105 |
| 2004/0024545 A1 * | 2/2004 | Tian | ...... | H02H 3/14 702/60 |
| 2005/0062460 A1 * | 3/2005 | Blake | ...... | G01R 15/247 324/96 |
| 2006/0057890 A1 * | 3/2006 | Feldman | ...... | H01R 13/717 323/300 |
| 2008/0124020 A1 * | 5/2008 | Niewczas | ...... | G01R 15/24 385/13 |
| 2010/0213952 A1 * | 8/2010 | Locker | ...... | G01R 19/06 324/658 |
| 2011/0050207 A1 * | 3/2011 | Bohnert | ...... | G01R 15/241 324/96 |
| 2011/0102767 A1 * | 5/2011 | Volanthen | ...... | G01R 29/0842 356/32 |
| 2011/0178649 A1 * | 7/2011 | Pieri | ...... | H02H 3/14 700/293 |
| 2012/0074953 A1 * | 3/2012 | Stickelmann | ...... | G01R 29/16 324/537 |
| 2014/0210453 A1 * | 7/2014 | El-Essawy | ...... | G01R 15/142 324/126 |
| 2016/0036214 A1 * | 2/2016 | Meiri | ...... | H02H 7/263 361/86 |
| 2016/0187389 A1 * | 6/2016 | Kshirsagar | ...... | G01R 19/0046 324/76.11 |
| 2016/0377660 A1 * | 12/2016 | Muller | ...... | G01R 15/246 324/96 |
| 2019/0003880 A1 * | 1/2019 | Lardat | ...... | G08C 23/06 |
| 2019/0173271 A1 * | 6/2019 | Meyer | ...... | H02H 3/38 |
| 2019/0212374 A1 * | 7/2019 | Cabaussel | ...... | G01R 27/16 |
| 2019/0302175 A1 * | 10/2019 | Nakash | ...... | H02H 3/32 |
| 2020/0191833 A1 * | 6/2020 | Kato | ...... | G01R 31/312 |

* cited by examiner

MULTI-PHASE SENSOR MODULE, SYSTEMS AND METHODS

CROSS-REFERENCE TO RELATED APPLICATIONS

The present application is the U.S. national stage application of International Application No. PCT/GB2018/050918, filed Apr. 5, 2018, which international application was published on Oct. 11, 2018, as International Publication No. WO2018/185490. The International Application claims priority to British Patent Application No. 1705578.1, filed Apr. 6, 2017, the contents of which are incorporated herein by reference in their entireties.

The present invention relates to the field of multi-phase power transmission such as may be employed in subsea or subterranean power transmission or distribution. More specifically, the present invention concerns improvements to sensing arrangements which enable phase-to-phase voltages in a multi-phase cable to be determined. In a particular embodiment of the invention there is provided a multi-phase sensor module having a spacer and a plurality of fibre Bragg grating based voltage sensors disposed on the spacer, and in another embodiment of the invention there is provided a cable monitoring arrangement comprising a plurality of multi-phase sensor modules and an optical interrogation system.

BACKGROUND OF THE INVENTION

It is desirable from a protection, control and monitoring perspective to be able to measure, in real-time, the voltages and currents on subsea or subterranean power cables. By their nature, such power cables are typically in inaccessible locations, and the points where it is desirable to perform measurements and/or monitor the condition of the power cables are often very long distances (e.g. >50 km) from power supplies or topside civil structures, or are simply difficult to access.

From a reliability and safety perspective, it is highly desirable to enable measurement of voltage and, optionally, current non-intrusively and without any requirement for direct electrical contact with a conductor or the exposure of uninsulated conductor.

In particular, there has to date been no method by which the phase-to-phase voltages inside a power cable can be measured over long distances without requiring a power supply. Generally speaking, methods of measuring phase-to-phase voltages require a sensor incorporating active electronics. Providing power to sensors at remote locations and ensuring reliability of the power supply is a significant problem. While polarimetric Pockels sensors could in theory achieve measurements without power supplies, they would only be effective over short distances and could not be multiplexed—requiring for example multiple optical fibres per sensor.

Some approaches utilise copper pilot wires housed within the power cable to deliver power to sensors. These sensors may communicate the measured voltages back along an optical fibre also housed within the power cable. However, although the optical fibre permits long distance communication of measurement data, this technique relies upon power delivery along lossy wires which therefore cannot be guaranteed at such long distances.

Alternatively, it is known to install transformers which transform the power cable conductor voltage, which may be 10 to 30 kV, down to a low voltage, e.g. 24 to 240 V, to drive the sensor system. This approach is extremely costly as the transformers are expensive and due to the need to build and install subsea or subterranean power transformers, and inherently riskier than a non-contact, non-intrusive approach would understandably be.

Accordingly, it is an object of at least one aspect of the present invention to obviate and/or mitigate one or more disadvantages of known/prior arrangements.

Further aims and objects of the invention will become apparent from reading the following description.

SUMMARY OF THE INVENTION

According to a first aspect of the invention, there is provided a phase-to-phase voltage sensor module comprising;
 a spacer to hold two conductors at a predetermined spacing; and
 at least one voltage sensor disposed on the spacer so as to be located between the conductors;
 wherein the at least one voltage sensor comprises a fibre Bragg grating in contact with a piezoelectric element which expands and contracts responsive to the phase-to-phase voltage between the conductors.

Preferably, the spacer holds the conductors apart.

Most preferably, the at least one voltage sensor may be configured for measurement of the electric field between the conductors. The electric field is dependent on and therefore representative of the phase-to-phase voltage. Accordingly, the phase to phase voltage may be measured without electrical connection to the conductors. The piezoelectric element may be configured to expand and contract responsive to the electric field.

Preferably, the at least one sensor may comprise a pair of electrodes attached to the piezoelectric element to sample the electric field between the conductors and drive the piezoelectric element. Optionally, the electrodes may be hemispherical. Optionally, the electrodes may comprise copper.

Alternatively, the at least one voltage sensor may be configured to be electrically connected to the conductors. In this case, the piezoelectric element is directly driven by the voltages in the conductors, by which phase-to-phase voltage can be directly measured.

Advantageously, the spacer may comprise a dielectric material, which may be PTFE or PEEK (polyether ether ketone). Alternatively, the spacer may comprise a conducting material, which may be copper. Further alternatively, the spacer may comprise a composite material, which may comprise dielectric and conducting materials. The spacer may be produced by 3D printing or injection moulding.

Preferably, the spacer may comprise a regular geometric shape. Most preferably, the spacer may comprise a number of vertices or side faces corresponding to the number of phases (and hence conductors). Most preferably, the module comprises a voltage sensor disposed on each side of the spacer so as to be located between a pair of conductors.

In a preferred embodiment of the first aspect, particularly applicable to a three-phase system, the spacer comprises a triangular prism shaped or otherwise configured to hold three conductors apart at a predetermined spacing, wherein the module comprises three voltage sensors disposed on separate side faces of the spacer so as to be located between corresponding pairs of conductors.

In another embodiment of the first aspect, particularly applicable to a six-phase system, the spacer comprises a hexagonal prism shaped or otherwise configured to hold six conductors apart at a predetermined spacing, wherein the module comprises six voltage sensors disposed on separate side faces of the spacer so as to be located between corresponding pairs of conductors.

Preferably, the fibre Bragg grating or each fibre Bragg grating of the at least one voltage sensor, as the case may be, has a unique peak reflection wavelength. Accordingly, the or each fibre Bragg grating can be interrogated and uniquely identified using, for example, a wavelength division multiplexer. A time division multiplexer may be used if the or each fibre Bragg grating does not have a unique peak reflection wavelength.

Preferably, the piezoelectric element or each piezoelectric element of the at least one voltage sensor, as the case may be, comprises a bulk piezoelectric material. Alternatively, the or each piezoelectric element may comprise a stack of piezoelectric material. The piezoelectric material may comprise lead zirconate titanate, and may for example comprise PZT-5A or PZT-5H.

Optionally, the spacer may comprise one or more attachments to attach the conductors to the spacer. Preferably, the attachments are located at or near vertices of the spacer.

Optionally, the phase-to-phase voltage sensor module further comprises at least one current sensor. Preferably, the current sensor comprises a fibre Bragg grating in contact with a piezoelectric element, wherein the piezoelectric element is connected in parallel with a current transformer or a Rogowski coil and a burden resistor. If the current transformer is disposed around one of the conductors the current in the conductor can be measured. Embodiments of the first aspect of the invention may comprise features corresponding to the preferred or optional features of any other aspect of the invention or vice versa.

According to a second aspect of the invention there is provided a phase-to-phase voltage sensor module comprising;
  a spacer to hold two conductors apart at a predetermined spacing; and
  at least one voltage sensor disposed on the spacer so as to be located between the conductors;
  wherein the at least one voltage sensor comprises a fibre Bragg grating in contact with a piezoelectric element, and a pair of electrodes attached to the piezoelectric element, whereby the electrodes couple the electric field between the conductors to the piezoelectric element, whereby the piezoelectric element expands and contracts responsive to the phase-to-phase voltage between the conductors.

Embodiments of the second aspect of the invention may comprise features corresponding to the preferred or optional features of any other aspect of the invention or vice versa.

According to a third aspect of the invention there is provided a phase-to-phase voltage sensor module comprising;
  a spacer to hold two conductors apart at a predetermined spacing; and
  at least one voltage sensor disposed on the spacer so as to be located between the conductors;
  wherein the at least one voltage sensor comprises a fibre Bragg grating in contact with a piezoelectric element, and a pair of electrodes attached to the piezoelectric element to sample the electric field between the conductors and cause the piezoelectric element to expand and contract responsive to the phase-to-phase voltage between the conductors Embodiments of the third aspect of the invention may comprise features corresponding to the preferred or optional features of any other aspect of the invention or vice versa.

According to a fourth aspect of the invention, there is provided a phase-to-earth or phase-to-neutral voltage sensor module comprising;
  a spacer to hold a conductor and an earth or neutral conduit at a predetermined spacing; and
  at least one voltage sensor disposed on the spacer so as to be located between the conductor and the earth or neutral conduit;
  wherein the at least one voltage sensor comprises a fibre Bragg grating in contact with a piezoelectric element which expands and contracts responsive to the phase-to-earth or phase-to-neutral voltage between the conductor and the earth or neutral conduit.

Preferably, the spacer holds the conductor and the earth or neutral conduit apart.

A multi-phase sensor module may be provided by including a plurality of voltage sensors.

The at least one voltage sensor may be connected to the conductor and a grounding sheath of a multi-phase cable.

Embodiments of the fourth aspect of the invention may comprise features corresponding to the preferred or optional features of any other aspect of the invention or vice versa.

According to a fifth aspect of the invention, there is provided a phase-to-phase voltage sensor module comprising;
  at least one voltage sensor located between two conductors;
  wherein the at least one voltage sensor comprises a fibre Bragg grating in contact with a piezoelectric element which expands and contracts responsive to the phase-to-phase voltage between the conductors.

Preferably, the at least one sensor may comprise a pair of electrodes attached to the piezoelectric element to sample the electric field between the conductors and drive the piezoelectric element. Alternatively, the at least one voltage sensor may be electrically connected to the conductors.

Optionally, the at least one voltage sensor may locate in an indent between respective conductors.

Embodiments of the fifth aspect of the invention may comprise features corresponding to the preferred or optional features of any other aspect of the invention or vice versa.

According to a sixth aspect of the invention there is provided a cable splice comprising a cable splice housing and at least one phase-to-phase, phase-to-earth or phase-to-neutral voltage sensor module according to any of the preceding aspects.

Preferably, the or each phase-to-phase (or phase-to-earth or phase-to-neutral) voltage sensor module is arranged within the cable splice housing so as to hold two or more conductors (or a conductor and a ground or neutral conduit) apart at a predetermined spacing, whereby one or more voltage sensors disposed on the spacer of the module are located between one or more pairs of conductors (or pairs of conductors and ground or neutral conduits) so as to measure the phase-to-phase voltage between the conductors (or phase-to-ground or phase-to-neutral voltage between the conductors and ground or neutral conduits).

Optionally, the cable splice further comprises at least one current sensor associated with each conductor. Preferably, the at least one current sensor comprises a fibre Bragg grating in contact with a piezoelectric element, wherein the piezoelectric element is connected in parallel with a current transformer or a Rogowski coil disposed around the conductor and a burden resistor.

Most preferably, the voltage and/or current sensors are each connected to a single (i.e. same) optical fibre.

The cable splice may be a cable repair splice, and may be provided with terminals for connecting to respective ends of multiphase cable.

Embodiments of the sixth aspect of the invention may comprise features corresponding to the preferred or optional features of any other aspect of the invention or vice versa.

According to a seventh aspect of the invention, there is provided a method of retrofitting a phase-to-phase, phase-to-earth or phase-to-neutral voltage sensor module of any of the first to fifth aspects to a multiphase cable comprising two or more conductors, the method comprising installing a cable splice according to the sixth aspect in the multiphase cable.

The method may comprise locating the spacer of the at least one phase-to-phase, phase-to-earth or phase-to-neutral voltage sensor module between the two or more conductors, within the cable splice housing, so as to hold the conductors apart at the predetermined spacing and locate the one or more voltage sensors between corresponding pairs of conductors.

The method may optionally comprise stripping back cable ends to expose the conductors, and subsequently connecting corresponding conductors from each cable end within the cable splice housing. Preferably, at least one of the conductors is threaded through the current transformer or Rogowski coil of a current sensor of the cable splice.

Note that measurement or monitoring of phase-to-phase (or phase-to-earth or phase-to-ground as the case may be) does not require stripping back the cable ends; in this context stripping back the cable ends is for the purpose of performing a splice therebetween.

The method may comprise connecting an optical fibre from one cable end to another cable end within the cable splice housing and via the fibre Bragg gratings of the one or more voltage sensors and, optionally, current sensors within the cable splice housing.

Embodiments of the seventh sixth aspect of the invention may comprise features corresponding to the preferred or optional features of any other aspect of the invention or vice versa.

According to a eighth aspect of the invention there is provided a multiphase cable monitoring system comprising a phase-to-phase, phase-to-earth or phase-to-neutral voltage sensor module according to any of the first to fourth aspects connected to an optical fibre of the multiphase cable, and an optical fibre sensor monitoring system to interrogate the at least one voltage sensor of the phase-to-phase, phase-to-earth or phase-to-neutral voltage sensor module via the optical fibre.

Optionally, the system may comprise a plurality of phase-to-phase, phase-to-earth or phase-to-neutral voltage sensor modules disposed at different locations along the multiphase cable.

Optionally, the or each phase-to-phase, phase-to-earth or phase-to-neutral voltage sensor module may be comprised in a cable splice according to the fifth aspect. The or each cable splice may comprise one or more current sensors, and the optical fibre sensor monitoring system may also interrogate the one or more current sensors.

Preferably, each of the fibre Bragg gratings of the or each phase-to-phase, phase-to-earth or phase-to-neutral voltage sensor module may comprise a unique peak reflection wavelength, and the optical fibre sensor monitoring system may comprise a wavelength division multiplexer. Alternatively, the fibre Bragg gratings may not comprise unique peak reflection wavelengths, and the optical fibre sensor monitoring system may comprise a time division multiplexer.

Optionally, the multiphase cable may comprise a subsea power transmission cable. Alternatively, the multiphase cable may comprise a subterranean power transmission cable. The multiphase cable may further alternatively comprise a power distribution cable. The invention can also be applied to other three-phase systems, such as oil and gas umbilicals and the like.

Embodiments of the eighth aspect of the invention may comprise features corresponding to the preferred or optional features of any other aspect of the invention or vice versa.

BRIEF DESCRIPTION OF THE DRAWINGS

There will now be described, by way of example only, various embodiments of aspects of the invention with reference to the drawings, of which.

DETAILED DESCRIPTION OF PREFERRED EMBODIMENTS

As discussed in the background to the invention above it is desirable to be able to measure, in real-time, the voltages and currents on subsea or subterranean power cables at long distances and without the need for power supplies. It is also highly desirable to be able to measure voltage and current non-intrusively and without any requirement for direct electrical contact with a conductor or the exposure of uninsulated conductor. In particular, it is an object of at least one aspect of the invention to measure phase-to-phase voltages inside a power cable without requiring a power supply.

By utilising the optical fibre incorporated in modern power cables, the invention allows phase-to-phase voltages to be measured over very long distances (e.g. up to 100 km before signal boosting is required), without any requirement for power supplies at remote measurement locations. The invention allows a high number of such measurement points to be placed at regular or strategic locations along a power cable without using more than a single fibre core. Furthermore, in embodiments of the invention described below, non-intrusive measurement of phase-to-phase voltage (and, optionally, current) is made possible.

Fibre Bragg Grating Optical Fibre Sensor

Figure 1:
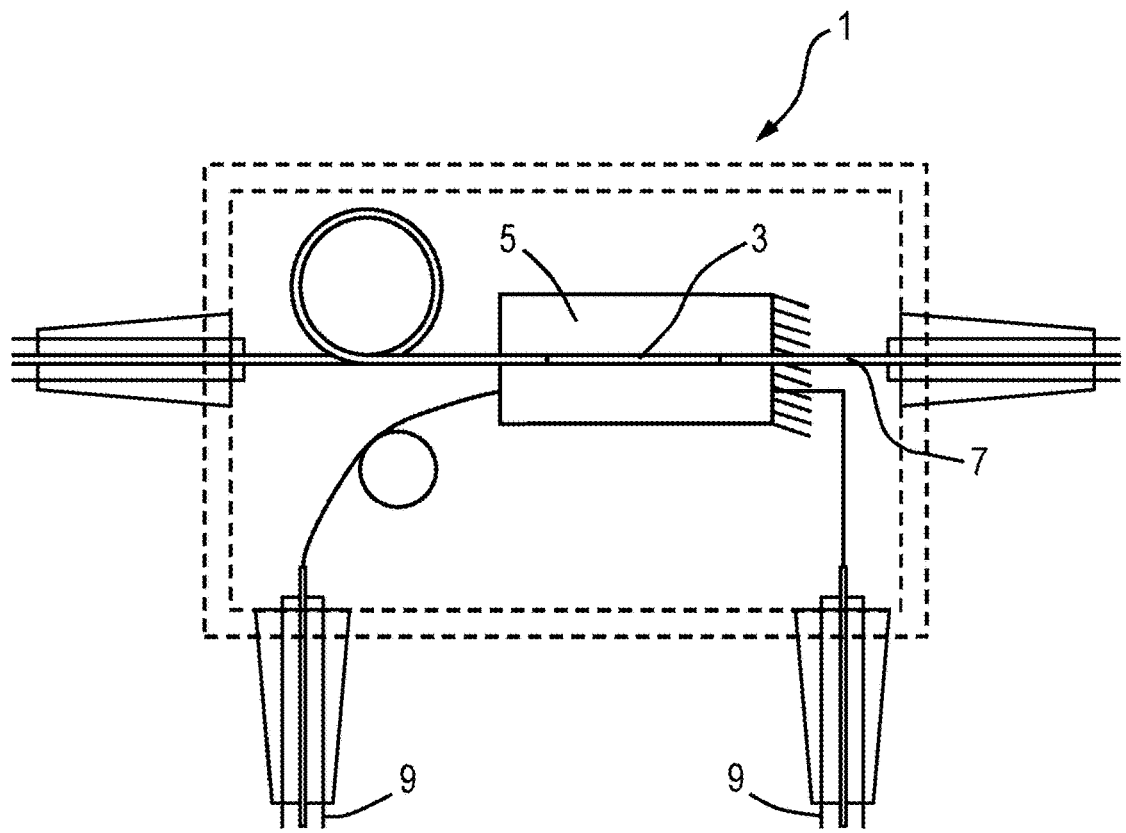
FIG. 1 illustrates a fibre Bragg grating based optical voltage sensor.

FIG. 1 illustrates a sensor 1 which combines an optical strain sensor with a piezo-electric element to provide a mechanism for the measurement of voltage at a remote location. The optical strain sensor comprises a fibre Bragg grating (FBG) 3 which is written in the core of an optical fibre 7 using standard writing technologies (such as UV interference and masking). The FBG 3 will reflect at the Bragg wavelength, $\lambda_B = 2$ n$\Lambda$, where n is the effective core index of refraction and $\Lambda$ the pitch of the grating. Accordingly, FBG 3 effectively acts as a wavelength-specific reflector; the peak reflection wavelength dependent on the periodicity of the variation in the refractive index in the fibre core (i.e. the pitch of the grating).

In this example a piezo-electric element 5 (which may be a piezo-electric stack) is in physical contact with (e.g. bonded to) the optical fibre in the region of the FBG 3. As the piezo-electric element 5 expands and contracts under an applied voltage (via terminals 9), the FBG 3 is also made to expand and contract thus altering the pitch of the grating and hence the Bragg wavelength. The instantaneous spectral position of the peak reflection wavelength of the FBG 3 is therefore indicative of the voltage applied to the piezo-electric element 5. Accordingly, a monitoring system (see below) can be configured to determine the voltage applied to the piezo-electric element 5 using the instantaneous spectral position of the peak reflection wavelength.

In an alternative example, the FBG may not be attached directly to the piezo-electric element, and instead 'strung' between end caps that are attached to the piezo-electric element. In such an arrangement, the strain may be equalised over the grating, and the fibre may be pretensioned, resulting in improved performance compared to the direct attachment arrangement above.

Such a sensor may also be employed as a current sensor by connecting the piezoelectric element and bonded FBG in parallel with a current transformer (CT) and a burden resistor. Monitoring the secondary current of the CT, transformed into a voltage via the burden resistor, provides a measure of the primary current in a cable enclosed by the CT. A Rogowski coil, which has a dielectric core, may be used in place of the CT.

Optical Fibre Sensor Monitoring System

Figure 2:
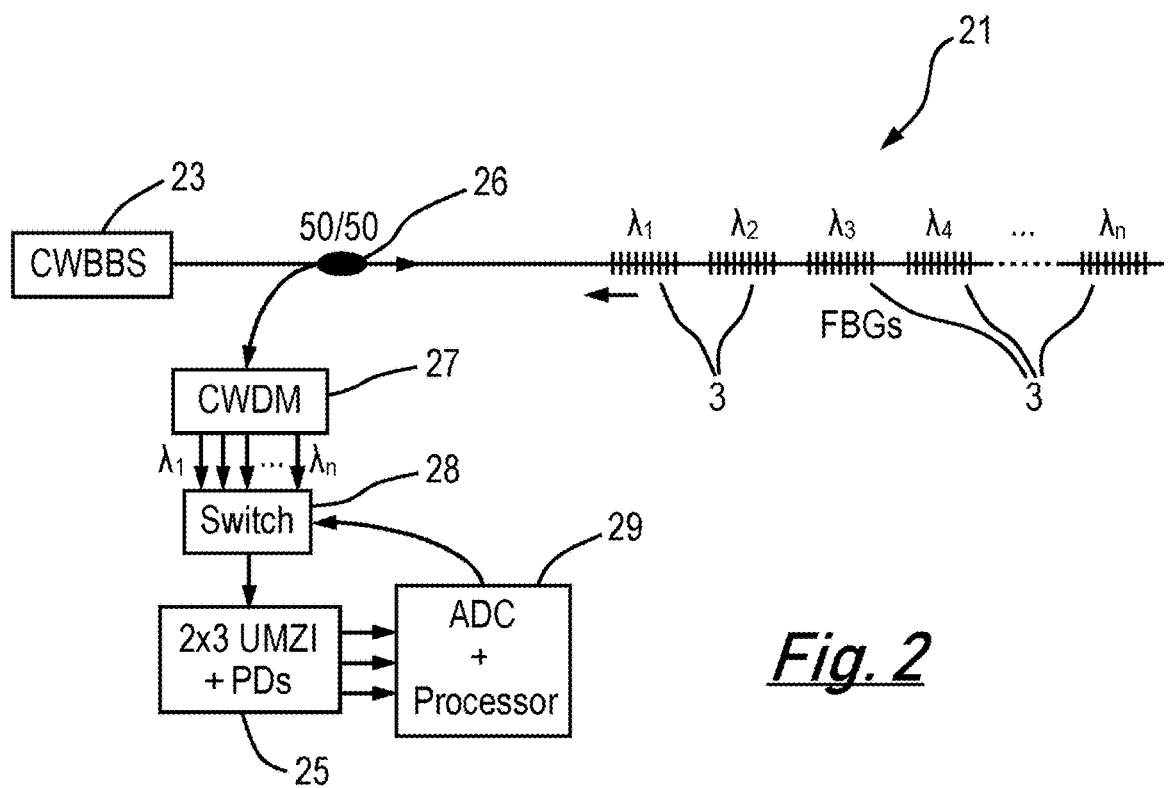
FIG. 2 illustrates an optical fibre sensor monitoring system.

FIG. 2 illustrates in schematic form a monitoring system 21 suitable for monitoring a plurality (n) of FBGs 3 in an optical fibre 11. Each FBG 3 is sensitive to a different wavelength of light ($\lambda_1, \lambda_2, \lambda_3, \lambda_4 \ldots \lambda_n$) by appropriate selection of the periodicity of the variation in the refractive index of the fibre core (i.e. the pitch of the grating—see above).

The system comprises a broadband light source 23 for illuminating the optical fibre 11 with an interrogation signal which has a wavelength range covering the reflection wavelengths of all the FBGs 3 located along the optical fibre 11. Light passes along the fibre 11 and light reflected from each of the FBGs 3 is simultaneously and continuously fed into a wavelength division multiplexer 27 (via a coupler 26) which separates light received from the optical fibre 11 into a plurality of wavelengths (and associated fibres) each corresponding with one of the FBGs 3. A fast optical path switch 28, driven by ADC/Processor unit 29, guides the reflected signal from each FBG 3 in turn to an interferometer and demodulation platform 25.

The ADC/Processor unit 29 then processes the output from the interferometer and demodulation platform 25 to determine the wavelength of the reflected light in each channel and thereby determine the instantaneous voltage being applied to the piezo-electric element associated with the respective FBG 3. This can be done, for example, by comparing the instantaneous spectral position of the reflection peak with calibration data or a look-up table.

Alternatively, a time division multiplexer (not shown) can be used to separate light received from the optical fibre 11 into a time-separated series. In such an arrangement, the FBGs 3 are not required to exhibit unique peak reflection wavelengths. A combination of time division and wavelength division multiplexing techniques may be used to interrogate very large arrays of FBGs.

Multi-Phase Sensor Module

An embodiment of a multi-phase sensor module according to the invention shall now be described with reference to FIGS. 3 and 4.

Three-phase electric power is the most commonly used method of AC electric power generation, transmission and distribution. In a typical three phase power supply system, three conductors carry an AC current of equal frequency and amplitude (voltage) with a phase difference of 120° between the conductors. The benefits of three-phase electric power transmission are well understood in the art, but as noted in the background above there is a desire to measure phase-to-phase voltages inside a power cable without requiring a power supply, i.e. without incorporating active electronics.

The applicant has also realised that measurement of phase-to-phase voltages in the manner(s) which will be described below overcomes the problem of referencing a voltage measurement to ground, which can be particularly difficult in splice housings (one way in which the present invention might be implemented, see below).

Figure 3:
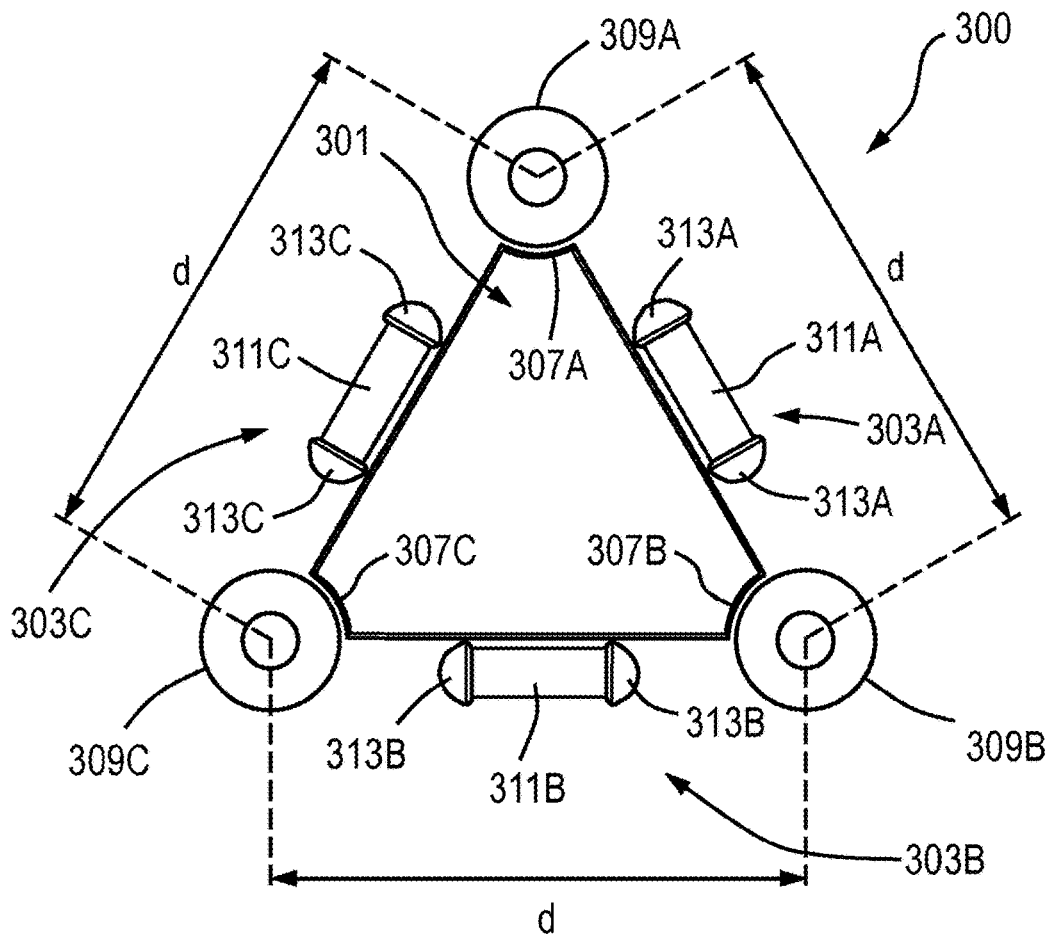
FIG. 3 illustrates a three-phase sensor module according to an aspect of the invention.
Figure 4:
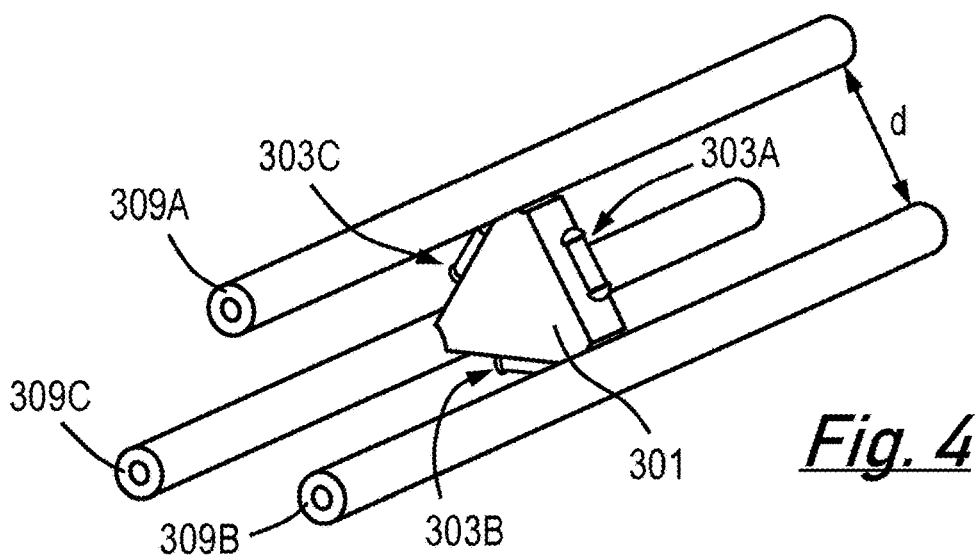
FIG. 4 is a perspective view of the three-phase sensor module illustrated in FIG. 3.

FIGS. 3 and 4 illustrate a three-phase sensor module 300 which comprises a spacer 301 having a triangular prism shape and three FBG based sensors 303A, 303B, 303C disposed on side faces 305A, 305B, 305C of the spacer 301. The vertices 307A, 307B, 307C of the triangular spacer 301 are shaped to locate respective conductors 309A, 309B, 309C of a three-phase transmission cable (not shown). A predetermined separation d between pairs of conductors 309A-309B, 309B-309C and 309C-309A can be achieved by appropriate selection or design of the spacer 301. Attachments such as clamps (not shown) may be provided to attach the spacer 301 to the conductors and hold them in place.

In this embodiment, the spacer 301 comprises PTFE, although any dielectric material may be used, for example PEEK. However, as will be discussed below, while it is preferred that the spacer 301 comprises a dielectric material it is also envisaged that a conducting material may be used, such as copper. A composite material, such as a dielectric material surrounding a conducting material, might also be employed, in which the conducting material (e.g. a metal) provides structural strength and rigidity.

In a similar manner to the FBG sensor described above, each of the sensors 303A, 303B, 303C comprise a piezo-electric element 311A, 311B, 311C, which may be bulk cylindrical piezoelectric elements or piezoelectric stacks, which is bonded to an FBG (not shown). At the ends of each piezoelectric element 311A, 311B, 311C there is provided a pair of copper electrodes 313A, 313B, 313C which enables sampling of the electric field between each pair of conductors which, in turn, drives the piezoelectric element and modulates the associated FBG. Note that in this embodiment hemispherical electrodes are preferred, in order to better direct the electric field lines, although any suitable shape, or indeed material, of electrode may be employed.

By arranging the sensors 303A, 303B, 303C and the conductors 309A, 309B, 309C symmetrically, cross-talk from the electric field generated by the respective third conductor (e.g. 309C when measuring between 309A and 309B) is minimised. In an exemplary embodiment, the spacer 301 sets the separation d between each pair of conductors to 80 mm. Although different separations may be required for different operational conditions, provision of a spacer of a predetermined size and configuration allows the required separations to be reliably, and reproducibly, repeated at different points along the length of cable being monitored.

For the purposes of simulation, two different piezoelectric materials have been considered: lead zirconate titanate PZT-5A and lead zirconate titanate PZT-5H (hereafter abbreviated to PZT-5A and PZT-5H, respectively). The pertinent parameters for these two materials are shown in Table 2 below. In the simulations, these actuators are assumed to be bulk cylindrical piezoelectric elements of diameter 8 mm and length 20 mm, situated in air at room temperature.

TABLE 1

Piezoelectric properties of lead zirconate titanate PZT-5A and lead zirconate titanate PZT-5H.

| Property | Description | PZT-5A | PZT-5H |
|---|---|---|---|
| $d_{33}$ (pm/V) | Piezoelectric coefficient | 374 | 593 |
| $K^T_3$ | Relative dielectric constant | 1800 | 3800 |
| $k_{33}$ | Coupling coefficient | 0.72 | 0.75 |

Figure 5:
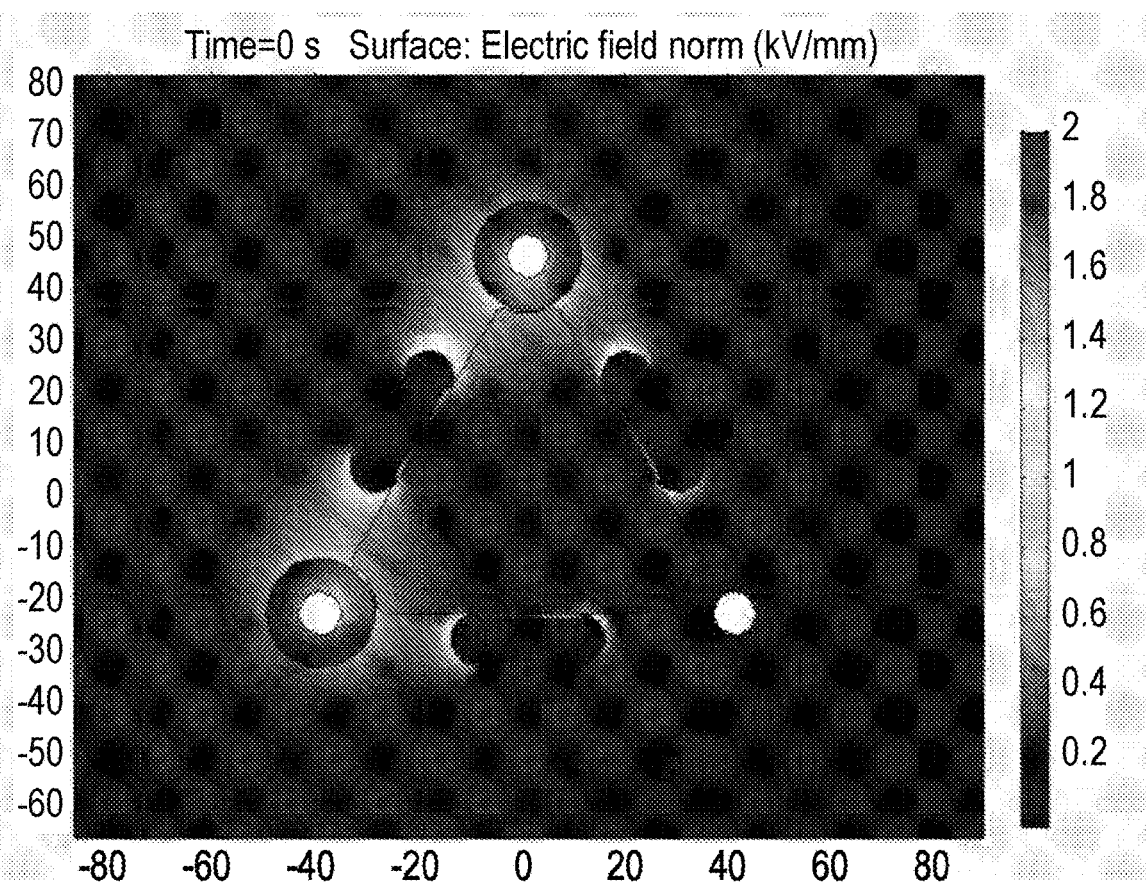
FIG. 5 is a simulation of the electric field about the three-phase conductors and piezoelectric elements of the three-phase sensor module illustrated in FIGS. 3 and 4.
Figure 6:
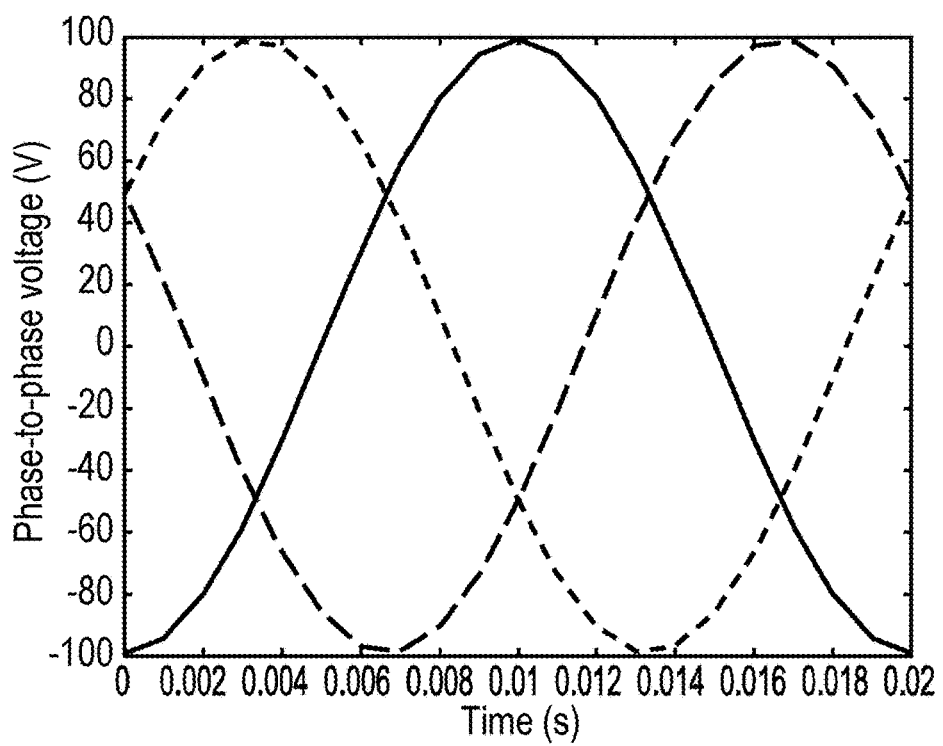
FIG. 6 is a simulation of the voltage across each piezoelectric element in the three-phase sensor module illustrated in FIGS. 3 and 4.

FIG. 5 illustrates a simulation of the electric field about the three-phase conductors 309A, 309B, 309C and sensors 303A, 303B, 303C of the three-phase sensor module 300 described above and illustrated in FIGS. 3 and 4. The voltage across each piezoelectric element 311A, 311B, 311C due to the electric fields about each conductor 309A, 309B, 309C can be estimated from the simulations. FIG. 6 illustrates the simulated voltage across each of the three sensors 303A, 303B, 303C with each conductor 309A, 309B, 309C operating at its rated 11 kV. The maximum piezoelectric voltage with the particular dimensions and materials chosen (above) is observed to be 100 V.

Figure 7:
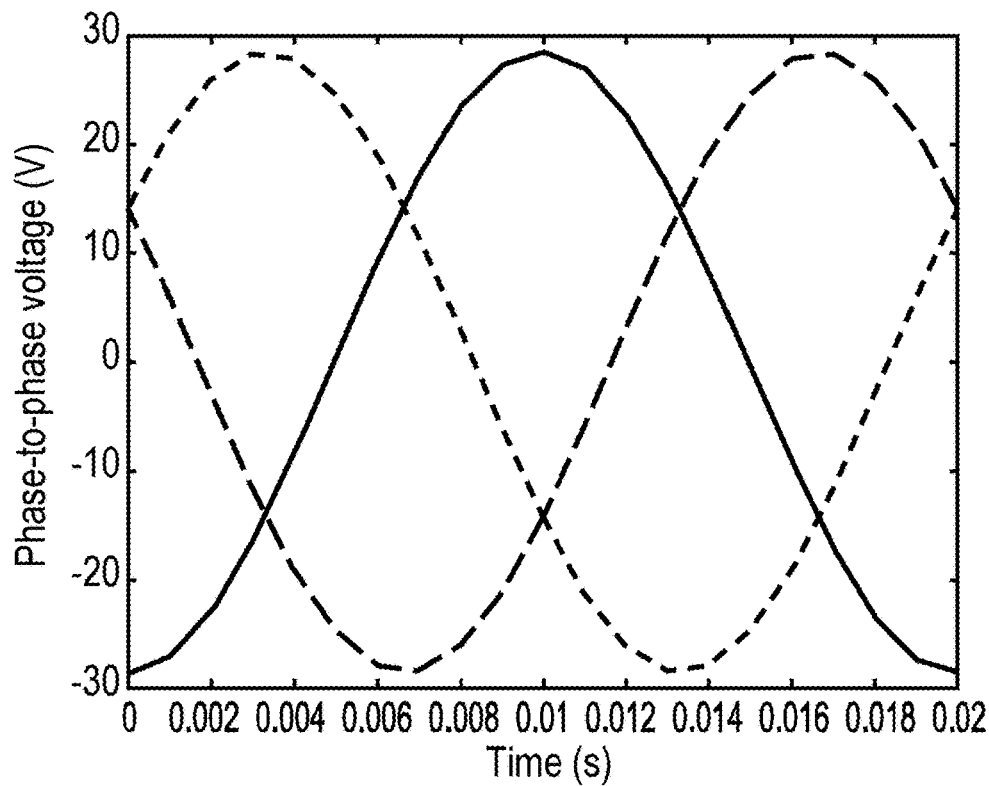
FIG. 7 is a simulation of the voltage across each piezoelectric element in an alternative three-phase sensor module incorporating a copper spacer.

The choice of material from which the spacer 301 is formed can significantly affect the electric field distribution, and hence the voltage across each piezoelectric element 311A, 311B, 311C. The simulation was performed again with the spacer material chosen to be conductive to investigate whether shielding of the third conductor is improved. In this instance, the spacer appears to 'guide' the field lines away from the electrodes, with a resulting reduction in voltage between the sensor electrodes of almost 75%. The voltage across each sensor with a copper spacer is shown in FIG. 7.

Figure 8:
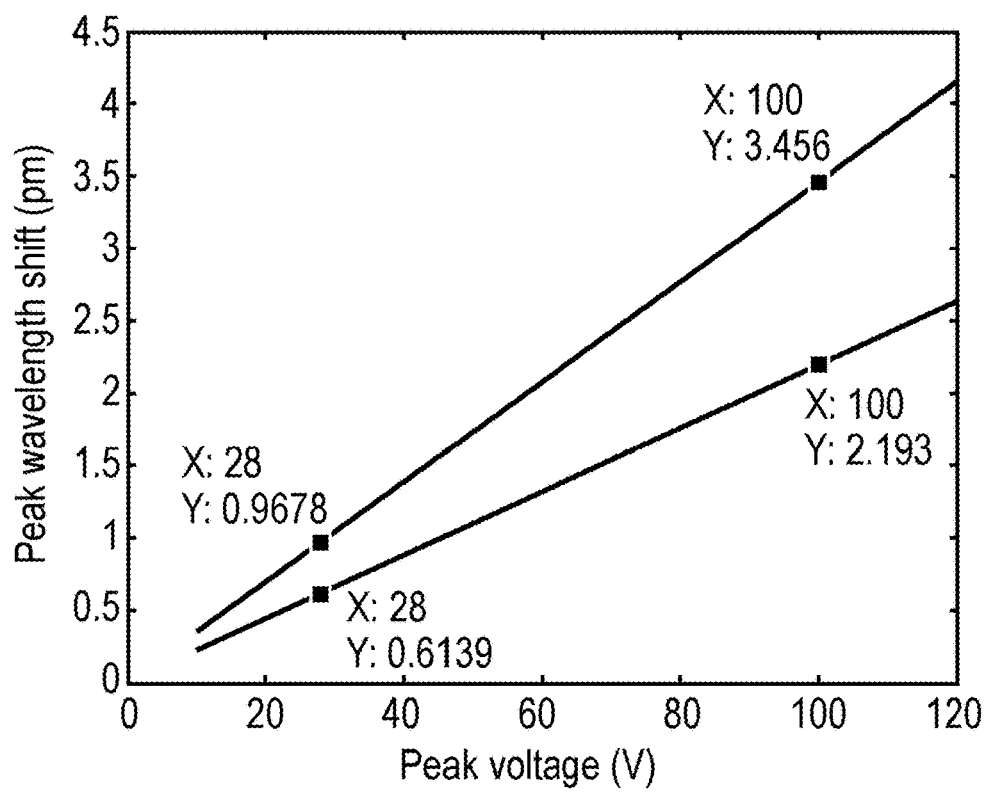
FIG. 8 graphs the relationship between anticipated peak wavelength shift as a function of voltage across the piezoelectric elements in a voltage range applicable to the three-phase sensor module illustrated in FIGS. 3 and 4 and the alternative three-phase sensor module to which FIG. 7 relates.

FIG. 8 graphs the strain-induced wavelength shift of an FBG resulting from the voltage applied to piezoelectric elements PZT-5A and PZT-5H. The strain imparted to the fibre (containing the FBG and to which the piezoelectric element is bonded) is determined using the piezoelectric coefficient, $d_{33}$, given in Table 1, on the assumption that the fibre is bonded to the piezo along its 20 mm length. This strain is then converted to a wavelength shift using the Bragg equation.

With a PTFE spacer, which in the example above experiences a maximum piezoelectric voltage of 100 V, the peak wavelength shifts are approximately 2.19 pm and 3.46 pm, respectively. With a copper spacer, which in the example above experiences a maximum piezoelectric voltage of approximately 28 V, the peak wavelength shifts are approximately 0.61 pm and 0.97 pm. If a strain noise floor on the interrogation system (as above) of 10 n$\varepsilon$/$\sqrt{Hz}$ is assumed, these would then correspond to signal-to-noise level estimates of 34.3 dB and 38.2 dB when using a PTFE spacer, and 23.2 dB and 27.2 dB with a copper spacer. While these signal sizes are both small compared with direct connection to the conductors (see below) it will be possible to safely and accurately monitor the optical signal from each sensor, although it is clearly preferable to use a dielectric spacer.

Note that while the invention has been exemplified above with reference to a three-phase system, it will be understood that it can be applied to any multi-phase system. For example, in a two-phase system, a multi-phase sensor module according to the invention might incorporate one FBG sensor located on a spacer between the conductors or two FBG sensors located on opposite faces of the spacer. Alternatively, higher-order multi-phase systems may also be accommodated by adopting spacers of regular geometric shapes having a number of vertices or sides corresponding to the number of phases (and hence conductors).

For example, examples of high-phase-order systems for power transmission having six or twelve phases have been built and tested. A six-phase system, for example, might be monitored using a spacer of regular hexagonal prism shape with a total of six sensors disposed on respective side faces of the spacer. It is anticipated that similar cross-talk reduction or elimination to that witnessed with the three-phase sensor module described above will be observed.

Developments in 3D printing technologies may enable spacers to be easily and reproducibly manufactured to predetermined arrangements and dimensions. The designs of the spacers may be optimised through modelling such that electric fields generated by the conductors are well aligned with respective sensors, and to minimise cross-talk between the sensors.

It is of course preferable from a reliability and a safety perspective that voltage and/or current be measured non-intrusively and without any requirement for direct electrical contact with a conductor or the exposure of uninsulated conductor. The above-described embodiment (and variants) provides a repeatable geometry for conductors which may be used, for example, within a splice housing (see below) and which samples the electric field strength and may thereby allow determination of phase-to-phase voltage between conductors in a minimally invasive manner.

However, it is nonetheless envisaged that a more invasive approach can be adopted in which the phase-to-phase voltage is measured by directly connecting terminals of each piezoelectric element directly to the two conductors between which the relative voltage is to be measured. In such an embodiment, as the sensor module is not sampling an electric field the (hemispherical copper) electrodes may be dispensed with. Assuming each conductor is operating at its rated voltage of 11 kV, the rms phase-to-phase voltage will be 19 kV; this corresponds to a peak phase-to-phase voltage of 26.9 kV to be measured by each voltage sensor.

Figure 9:
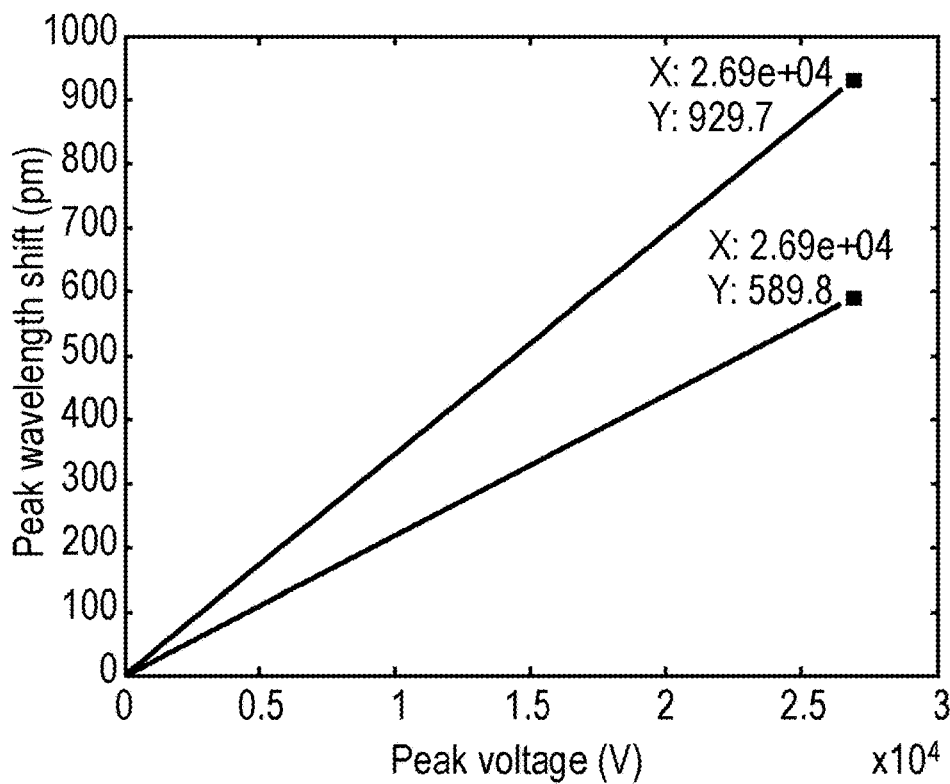
FIG. 9 graphs the relationship between anticipated peak wavelength shift as a function of voltage across the piezoelectric elements in a voltage range applicable to a further alternative three-phase sensor module in which the piezoelectric elements are directly connected to conductors.

With each piezoelectric element directly connected across its terminals to two conductors, then, it would experience a peak voltage of 26.9 kV. FIG. 9 extends the graph shown in FIG. 8 up to the maximum at 26.9 kV, for both piezoelectric materials. It can be seen that at the maximum applied voltage the peak wavelength shifts are approximately 590 pm and 930 pm for PZT-5A and PZT-5H respectively. The full peak-to-peak wavelength shifts are thus 1.18 nm and 1.86 nm. Assuming a strain noise floor on the interrogation system (such as described above) of 10 nEkHz, these would then correspond to signal-to-noise level estimates of 82.9 dB and 86.8 dB respectively.

Note that it is envisaged that instead of providing a spacer, or at least instead of providing a spacer which holds the conductors apart, insulated conductors may touch; the spacer effectively provided by the insulation which keeps the conductors themselves from touching.

In such an arrangement, the voltage sensor may be located in an indent between respective conductors thus minimising the space requirements of the sensor module.

A spacer which does not hold the conductors apart (i.e. wherein the insulated conductors touch) may still define a particular geometry between the conductors and the piezoelectric elements, for example the spacer may be sized to occupy the internal space between the conductors, and may have slim arms which extend between the conductors to enable location of the piezoelectric elements in the desired locations.

Furthermore, in such a configuration where the voltage sensors are located in indents, the piezoelectric elements can be arranged lengthwise; that is, the longer dimension of the piezoelectric elements (and the FBGs) are parallel with the conductors. In such a configuration the piezoelectric elements would be elastically compliant in so called direction 11 (as opposed to direction 33), that is perpendicular to the direction in which ceramic element is polarized.

Subsea Cable Integration

Figure 10:
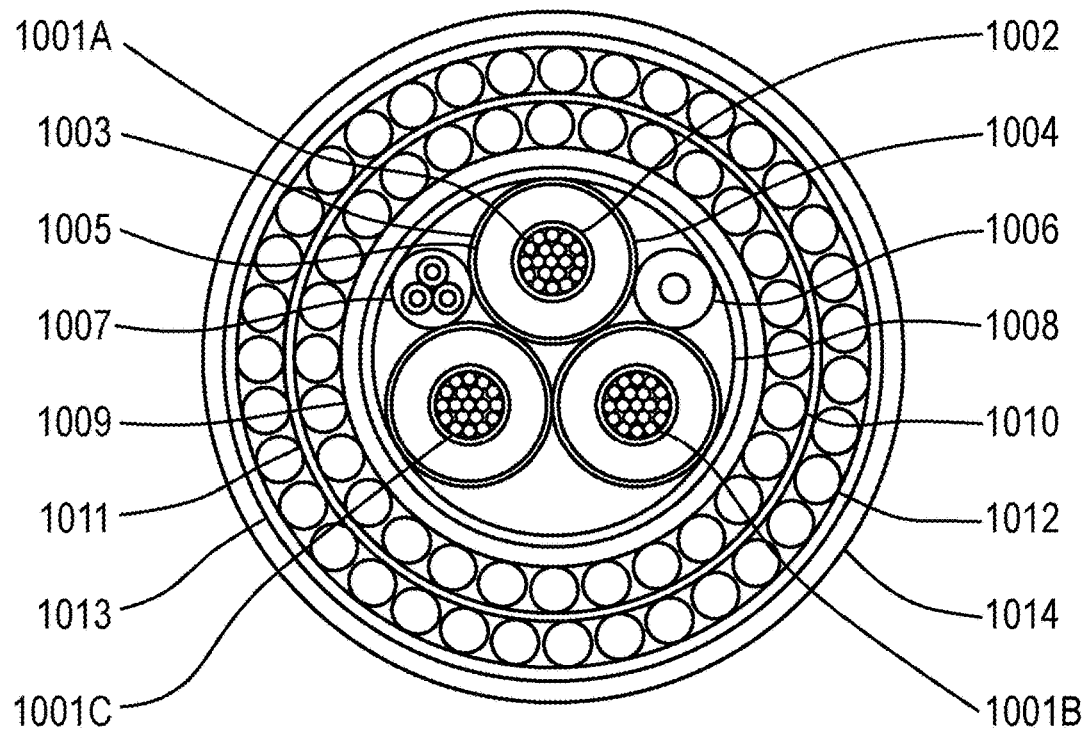
FIG. 10 is a cross-sectional view of a typical subsea three-phase power transmission cable.

FIG. 10 shows a cross-sectional view of a typical subsea cable, in this case a three-core insulated and armoured subsea cable, such as may be employed in offshore wind- and wave-power infrastructure for three-phase electric power transmission. Definitions of the parts of the cable are summarised in Table 2 below. Notably, within the cable is provided a fibre optic package comprising one or more single-mode optical fibres.

TABLE 2

Part description and material definitions of example subsea cable illustrated in FIG. 10.

| Item | Description | Material |
| --- | --- | --- |
| 1001 | Conductor | Stranded copper |
| 1002 | Conductor screen | Extruded semi-conductor |
| 1003 | Insulation | Extruded EPR |
| 1004 | Insulation screen | Extruded semi-conductor |
| 1005 | Metallic screen | Copper tape |
| 1006 | Fibre optic package | Single-mode fibres |
| 1007 | Pilot cores | 3 × 2.5 mm2 cores |
| 1008 | Bound cores | Cores, filler, tape |
| 1009 | Bedding | Jute |
| 1010 | Armour | Galvanised steel wires |
| 1011 | Separator | Hessian tape |
| 1012 | Armour | Galvanised steel wires |
| 1013 | Serving | Jute |
| 1014 | Serving | Polypropylene yarn |

Optical fibre within power transmission cables may be used to provide communication with monitoring equipment on or relating to, for example, offshore wind- and wave-power generation installations such as turbines. However, it is envisaged that one or more optical fibres within typical subsea cables can alternatively (or additionally) be used to communicate with multi-phase sensor modules according to the invention—to enable monitoring of the phase-to-phase voltages between the conductors 1001A, 1001B, 1001C.

It is also envisaged that current sensors of the type described above, wherein a piezoelectric stack and bonded FBG is connected in parallel with a CT and burden resistor, can be incorporated so as to facilitate current measurements on the conductors 1001A, 1001B, 1001C.

There are a number of requirements for the integration of sensors according to the invention in the subsea cable environment. It is particularly advantageous if the sensors are contained in a dry environment, as moisture can significantly degrade the performance of the piezoelectric element. Care should be taken with the design of the voltage sensing system to ensure the piezoelectric element is protected.

Provision may be made for splicing into an existing fibre optic cable. As mentioned above, power transmission cables typically incorporate several fibre optic cores for communications purposes which are spliced in the conventional way at cable ends or splice locations. It is envisaged that the voltage (and optionally current) sensors may be installed in a cable splice or terminator and that the fibre connections can be realised in a fibre 'splice housing' common to most cable splice designs. It is also envisaged that a single fibre may be adequate for sampling of each of the sensors (voltage and, if appropriate, current) employed.

It is envisaged that cable repair splices will be the most convenient installation point for retrofitting voltage (and optionally current) sensors according to the present invention. For example, there may be provided a customised repair splice which provides sufficient internal volume to install sensors, including the sensor module, and access the three conductors and at least one optical fibre.

When installing such a repair splice, each of the two cable ends being connected is stripped back to the three conductors (with semiconductor sheaths) and fibre optic bundles. Corresponding conductors are then connected and sealed individually, while the fibres are typically spliced together in a separate 'splice housing' to prevent damage to the weakened connection points. The entire stripped cable region, which may be more than 2 m in length, is then sealed with strain relief boots applied along the nearby lengths of cable.

It is envisaged that the voltage (and, optionally, current) sensors may be installed close to the conductors as they enter or exit the sealed splice region from either side of the repair splice. At this point the conductors are separated prior to being individually spliced and sealed, resulting in space between the three conductors for installation of a three-phase sensor module (such as described above) for phase-to-phase voltage sensing and for threading through small CTs for current sensing purposes (if applicable).

It is noted that in certain circumstances it may be appropriate to select or specify a certain material or materials and geometries in order to properly control or account for the electrical field so that electrical breakdown of materials does not occur in the region of the spacer/sensor module—e.g. in the cable splice region discussed above. It will be well within the capabilities of the skilled person to perform appropriate simulations to ascertain whether, and how, this should be done.

One or more (or indeed several) of such repair splices incorporating voltage (and, optionally, current) sensors may be interrogated along what is effectively a single continuous length of optical fibre, using a monitoring system such as described above, or indeed any one of a number of commercially available FBG interrogators. In the example of a subsea power transmission cable, once it has been retrofitted with voltage (and, optionally, current) sensors as described above, the single optical fibre into which the various sensors have been spliced can be illuminated with a broadband light source from an on-shore base station. Assuming each FBG has a unique wavelength across the bandwidth of the light source the reflected spectrum will consist of a number of FBG reflection peaks oscillating at 50 Hz with amplitude proportional to the voltage (or current) being measured. The invention therefore also enables a subsea cable monitoring system to be provided.

A number of variants to the invention are envisaged. For example, it is envisaged that where the inventive concept has been exemplified in terms of measuring phase-to-phase voltage it may similarly be employed to measure phase-to-ground or phase-to-neutral voltage. In such an arrangement, instead of coupling (wirelessly) or connecting to pairs of conductors the voltage sensors may be coupled or connected at one end to a conductor and at another end to a ground or neutral conduit, such as a grounding sheath within a multi-phase cable.

In summary, the invention enables the measurement of the voltage between phases (phase-to-phase voltages) of a multi-phase power cable, e.g. a three-phase power cable, such as may be used in subsea or subterranean environments for electrical power transfer. The invention does not require a power supply at the measurement location, and relies solely on optical fibres (typically present in such cables) to carry light to and from the sensors. Fibre Bragg grating (FBG) based sensors sample the electric field between conductors and convert to a strain on the fibre, as a result of which certain wavelengths of the reflected light are modulated by the instantaneous magnitude of the phase-to-phase voltages to be measured. A sensor module embodying the invention includes a spacer which holds the conductors in a predetermined geometry and locates the FBG sensors between pairs of conductors on which the phase-to-phase voltage measurements are to be performed. At an end of the cable, an interrogation system can extract and interpret the modulation of these wavelengths to infer the measured values of voltage. The invention may be incorporated into a repair splice for retrofitting purposes, and may also incorporate FBG-based current sensors to simultaneously measure current in the conductors.

Throughout the specification, unless the context demands otherwise, the terms "comprise" or "include", or variations such as "comprises" or "comprising", "includes" or "including" will be understood to imply the inclusion of a stated integer or group of integers, but not the exclusion of any other integer or group of integers.

Various modifications to the above-described embodiments may be made within the scope of the invention, and the invention extends to combinations of features other than those expressly claimed herein.

The invention claimed is:

1. A phase-to-phase voltage sensor module comprising;
   a spacer to hold two conductors at a predetermined spacing; and
   at least one voltage sensor disposed on the spacer so as to be located between the conductors;
   wherein the at least one voltage sensor comprises a fibre Bragg grating in contact with a piezoelectric element which expands and contracts responsive to the phase-to-phase voltage between the two conductors held at the predetermined spacing.

2. The phase-to-phase voltage sensor module of claim 1, wherein the spacer holds the conductors apart.

3. The phase-to-phase voltage sensor module of claim 1, wherein the piezoelectric element is configured to expand and contract responsive to the electric field between the conductors.

4. The phase-to-phase voltage sensor module of claim 1, wherein the at least one sensor comprises a pair of electrodes attached to the piezoelectric element to sample the electric field between the conductors and drive the piezoelectric element.

5. The phase-to-phase voltage sensor module of claim 4, wherein the electrodes are hemispherical.

6. The phase-to-phase voltage sensor module of claim 4, wherein the electrodes comprise copper.

7. The phase-to-phase voltage sensor module of claim 1, wherein the at least one voltage sensor is configured to be electrically connected to the conductors.

8. The phase-to-phase voltage sensor module of claim 1, wherein the spacer comprises a dielectric material, a conducting material, or a composite material comprising dielectric and conducting materials.

9. The phase-to-phase voltage sensor module of claim 1, wherein the spacer comprises a regular geometric shape.

10. The phase-to-phase voltage sensor module of claim 1, wherein the spacer comprises a number of vertices or side faces corresponding to the number of phases or conductors.

11. The phase-to-phase voltage sensor module of claim 1, wherein the module comprises a voltage sensor disposed on each side of the spacer so as to be located between a pair of conductors.

12. The phase-to-phase voltage sensor module of claim 1, wherein the fibre Bragg grating or each fibre Bragg grating of the at least one voltage sensor has a unique peak reflection wavelength.

13. The phase-to-phase voltage sensor module of claim 1, wherein the or each piezoelectric element of the at least one voltage sensor comprises a bulk piezoelectric material or a stack of piezoelectric material.

14. The phase-to-phase voltage sensor module of claim 1, wherein the spacer comprises one or more attachments to attach the conductors to the spacer at or near vertices of the spacer.

15. The phase-to-phase voltage sensor module of claim 1, wherein the multi-phase sensor module further comprises at least one current sensor, wherein the current sensor comprises a fibre Bragg grating in contact with a piezoelectric element, and wherein the piezoelectric element is connected in parallel with a current transformer or a Rogowski coil disposed around one of the conductors and a burden resistor.

16. A phase-to-earth or phase-to-neutral voltage sensor module comprising;
   a spacer to hold a conductor and an earth or neutral conduit at a predetermined spacing; and
   at least one voltage sensor disposed on the spacer so as to be located between the conductor and the earth or neutral conduit;
   wherein the at least one voltage sensor comprises a fibre Bragg grating in contact with a piezoelectric element which expands and contracts responsive to the phase-to-earth or phase-to-neutral voltage between the conductor and the earth or neutral conduit held at the predetermined spacing.

17. A multiphase cable monitoring system comprising a phase-to-phase voltage sensor module connected to an optical fibre of a multiphase cable, and an optical fibre sensor monitoring system to interrogate the at least one voltage sensor of the phase-to-phase voltage sensor module via the optical fibre, wherein the phase-to-phase voltage sensor module comprises a spacer to hold two conductors of the multiphase cable at a predetermined spacing, and at least one voltage sensor disposed on the spacer so as to be located between the conductors, wherein the at least one voltage sensor comprises a fibre Bragg grating in contact with a piezoelectric element which expands and contracts responsive to the phase-to-phase voltage between the conductors.

18. The system of claim 17, comprising a plurality of phase-to-phase voltage sensor modules disposed at different locations along the multiphase cable.

19. The system of claim 17, wherein each of the fibre Bragg gratings of the or each phase-to-phase voltage sensor module comprises a unique peak reflection wavelength.

20. The system of claim 19, wherein the optical fibre sensor monitoring system comprises a wavelength division multiplexer and/or a time division multiplexer.

* * * * *